United States Patent
Jain et al.

(10) Patent No.: US 10,522,202 B2
(45) Date of Patent: Dec. 31, 2019

(54) MEMORY DEVICE AND COMPENSATION METHOD THEREIN

(71) Applicant: TAIWAN SEMICONDUCTOR MANUFACTURING CO., LTD., Hsinchu (TW)

(72) Inventors: Sanjeev Kumar Jain, Ottawa (CA); Atul Katoch, Kanata (CA)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/960,406

(22) Filed: Apr. 23, 2018

(65) Prior Publication Data
US 2019/0325928 A1    Oct. 24, 2019

(51) Int. Cl.
| | | |
|---|---|---|
| G11C 7/22 | (2006.01) | |
| G11C 7/12 | (2006.01) | |
| G11C 7/06 | (2006.01) | |
| H03K 5/134 | (2014.01) | |
| H03K 5/135 | (2006.01) | |
| H03K 5/00 | (2006.01) | |

(52) U.S. Cl.
CPC ............... G11C 7/12 (2013.01); G11C 7/06 (2013.01); G11C 7/222 (2013.01); H03K 5/134 (2014.07); H03K 5/135 (2013.01); *H03K 2005/00078* (2013.01); *H03K 2005/00195* (2013.01)

(58) Field of Classification Search
CPC ..................................... G11C 7/22; G11C 7/10
USPC .............................................. 365/194, 189.05
See application file for complete search history.

(56) References Cited

U.S. PATENT DOCUMENTS

| | | | |
|---|---|---|---|
| 9,754,668 B1* | 9/2017 | Wang | G11C 7/22 |
| 9,805,776 B2* | 10/2017 | Lin | G11C 16/12 |
| 9,911,473 B1* | 3/2018 | Singh | G11C 5/025 |
| 9,947,419 B1* | 4/2018 | Sinha | G11C 29/02 |
| 10,236,055 B1* | 3/2019 | Kumar | G11C 11/419 |
| 2004/0090246 A1* | 5/2004 | Gans | G11C 7/065 327/57 |
| 2006/0262628 A1* | 11/2006 | Nii | G11C 5/063 365/226 |
| 2007/0002636 A1* | 1/2007 | Campbell | G11C 5/143 365/189.04 |
| 2007/0058407 A1* | 3/2007 | Dosaka | G11C 15/00 365/189.15 |
| 2007/0140012 A1* | 6/2007 | Roohparvar | G11C 16/0483 365/185.17 |
| 2007/0159900 A1* | 7/2007 | Aoki | G11C 29/02 365/203 |

(Continued)

*Primary Examiner* — Michael T Tran
(74) *Attorney, Agent, or Firm* — Maschoff Brennan

(57) ABSTRACT

A circuit is disclosed that includes an inverter unit and a switch unit. The inverter unit is coupled to a memory cell column. The inverter unit is configured to invert, in response to a first control signal and a second control signal, a first signal and to output a second signal for the enabling or disabling of a bit line keeper circuit that is configured to maintain a bit line to a voltage. The first signal is generated by the memory cell column. The switch unit is configured to couple a reference voltage to an input of the inverter unit, in response to a third control signal. The inverter unit is further configured to be deactivated in response to the reference voltage, the first control signal, and the second control signal.

20 Claims, 6 Drawing Sheets

(56) References Cited

U.S. PATENT DOCUMENTS

| | | | | |
|---|---|---|---|---|
| 2008/0019194 A1* | 1/2008 | Katayama | ................ | G11C 7/02 |
| | | | | 365/189.15 |
| 2010/0177585 A1* | 7/2010 | Rubinstein | .......... | G06F 13/1663 |
| | | | | 365/230.05 |
| 2010/0329062 A1* | 12/2010 | Campbell | ................ | G11C 7/04 |
| | | | | 365/226 |
| 2012/0195111 A1* | 8/2012 | Ramaraju | ................ | G11C 8/16 |
| | | | | 365/156 |
| 2014/0104934 A1* | 4/2014 | McLaury | .............. | H03M 1/001 |
| | | | | 365/154 |
| 2016/0148685 A1* | 5/2016 | Roy | ................... | G11C 13/0069 |
| | | | | 365/148 |
| 2017/0206945 A1* | 7/2017 | Lin | ........................ | G11C 16/08 |
| 2017/0372781 A1* | 12/2017 | O'Toole | ............. | G11C 13/0007 |

* cited by examiner

MEMORY DEVICE AND COMPENSATION METHOD THEREIN

BACKGROUND

For register files with single ended sensing, an inverter is used as a sense amplifier (also referred to as "sense inverter"). During read 0 operation, the bit line is discharged to a voltage below the switching threshold voltage of sense inverter, after the word line is enabled and the pre-charging of the bit line is turned off. During read 1 operation, the bit line discharges due to memory cell leakage but remains at the voltage above the switching threshold voltage of sense inverter. Due to higher leakage in latest CMOS (complementary metal-oxide-semiconductor) technology nodes, the bit line keeper circuit is introduced at the bit line in such a way that the bit line is not discharged to the voltage below the switching threshold voltage of sense inverter. However, the bit line keeper circuit impacts memory access time which is mainly dominated by read 0 operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
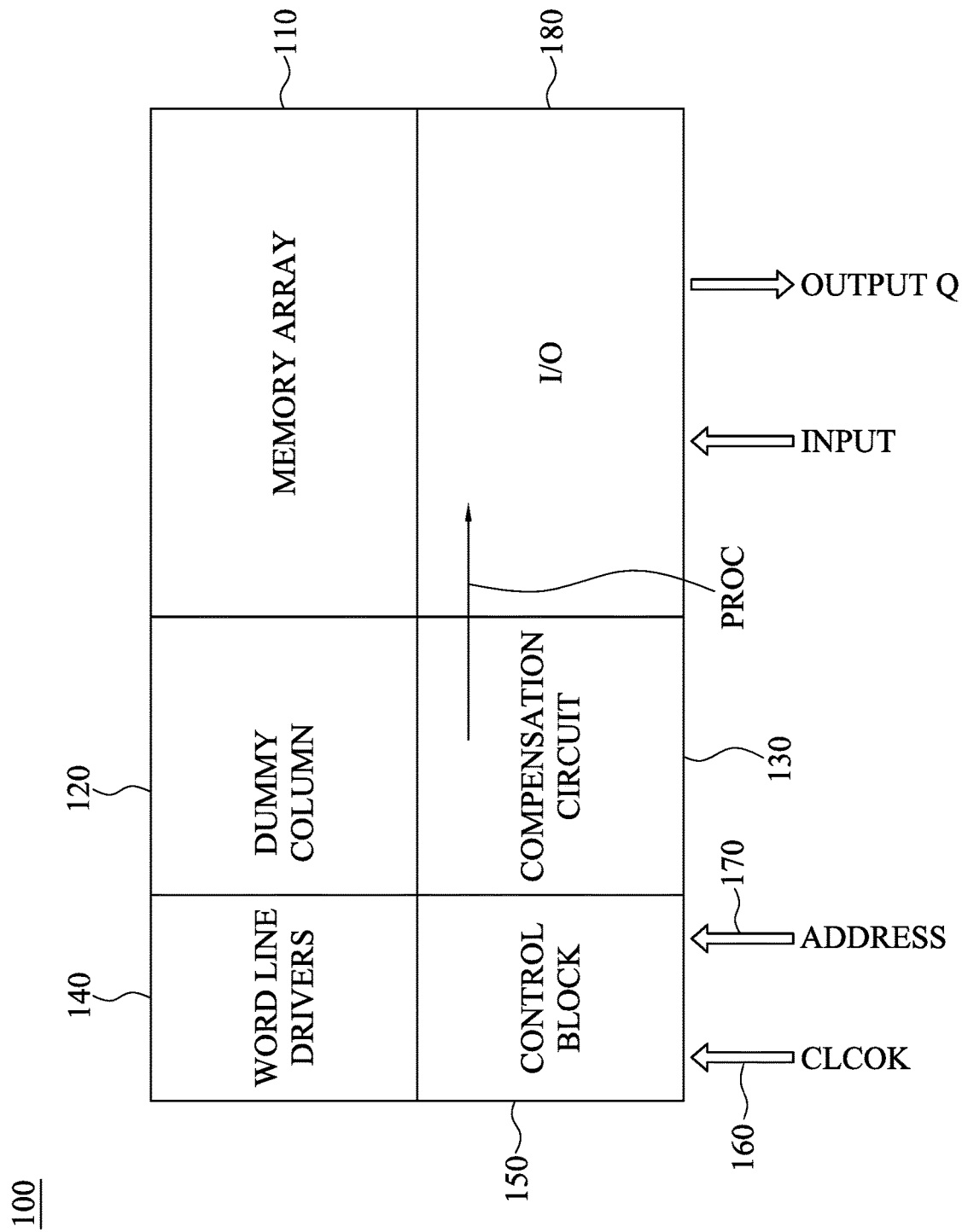
FIG. 1 shows the overall architecture of the memory device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 shows the overall architecture of the memory device, according to some embodiments of the present disclosure. A letter after a reference numeral, such as "110a", indicates that the text refers specifically to the element having that particular reference numeral. A reference numeral in the text without a following letter, such as "110", refers to any or all of the elements in the figures bearing those reference numerals (e.g. "110" in the text refers to reference numeral "110a" and/or "110b" in the figures).

Figure 2:
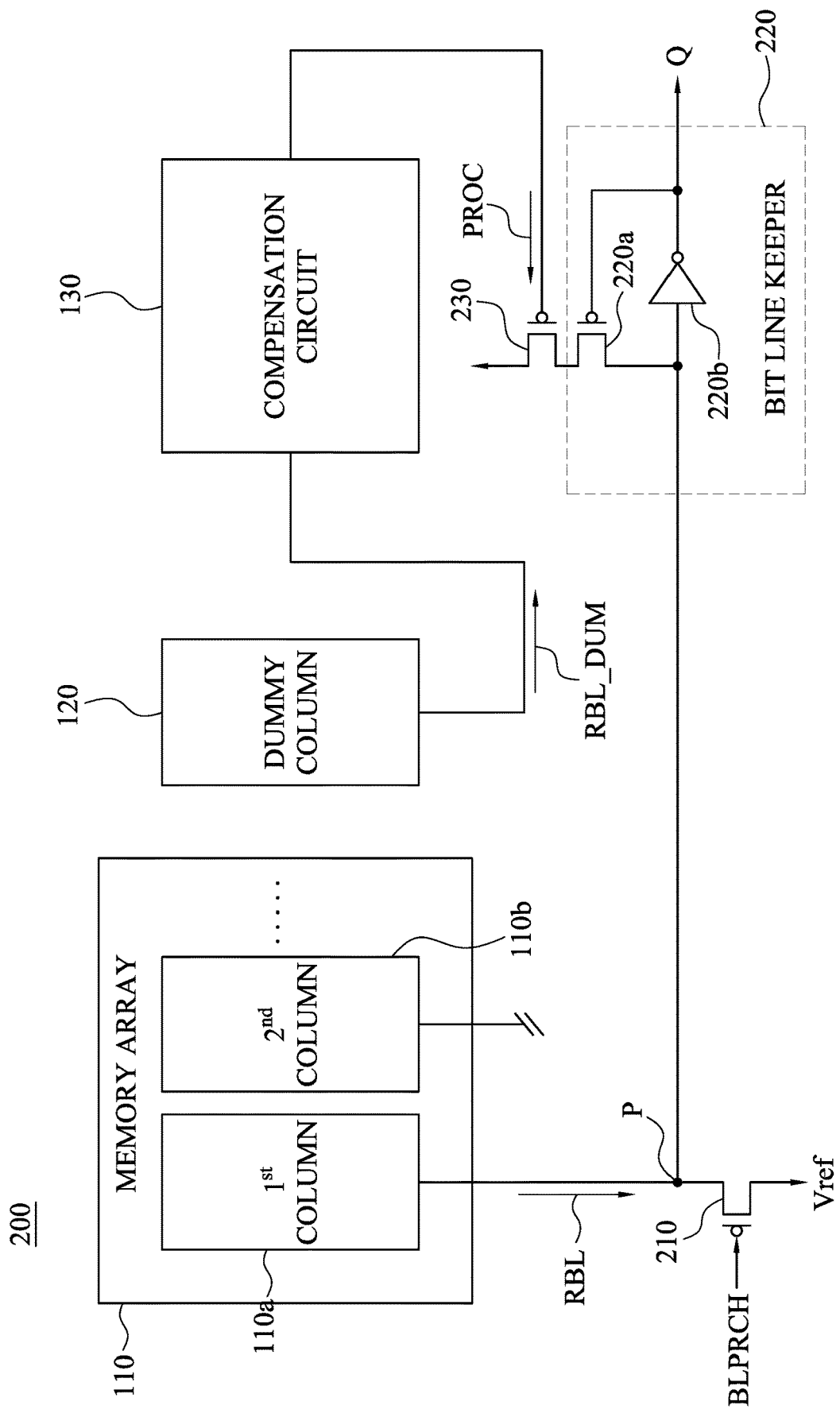
FIG. 2 is a schematic diagram of the memory device in FIG. 1, according to some embodiments of the present disclosure.

In some embodiments, the memory device 100 shown in FIG. 1 includes a memory array 110. The memory array 110 includes a plurality of columns (e.g. 110a, 110b, etc., as shown in FIG. 2). Each column includes a plurality of cells (not shown) configured to store a bit 0 value or a bit 1 value. In some embodiments, a bit 0 value indicates a logical "false" value and a bit 1 value indicates a logical "true" value). The memory device 100 receives an input clock signal 160 and an address signal 170 as inputs. The clock signal 160 is provided for the control of timing for various operations of the memory device 100. The address signal 170 identifies a specific word of the memory device that need to be operated.

In some embodiments, the control block 150 latches the clock signal 160 and the address signal 170 received by the memory device 100. The memory device 100 includes word lines (not shown). The word line driver 140, based on the word address received from the control block 150, selects a single word line from the word lines. A set of cells that correspond to a word value are connected to the corresponding word line. A self timing control circuit (not shown) generates internal clock signals based on the clock signal 160 to control timing of signals for various components of the memory device 100.

In some embodiments, the dummy column 120 provides a dummy signal (as indicated as "RBL_DUM" in FIG. 2) for the compensation circuit 130. In some embodiments, the dummy signal is a voltage signal. In other embodiments, the dummy signal is a current signal. The compensation circuit 130 is configured to perform compensation to the input/output (I/O) 180 according to the clock signal 160 and the dummy signal. The I/O 180 receives a signal PROC outputted from the compensation circuit 130, and provides an output Q of the memory device 100. In some embodiments, sense amplifiers (not shown) are also provided to detect the value transmitted from the cells at the addressed memory location in the memory device 100. In such embodiments, the I/O 180 provides the output Q of the memory device 100 based on the outputs of the sense amplifiers.

In some embodiments, the dummy signal as discussed above indicates the process-voltage-temperature (PVT) variation of the memory column. In some embodiments, the variation of the dummy signals indicates the process-voltage-temperature PVT variation of the memory column. In some embodiments, the behavior of the dummy signal indicates the process-voltage-temperature PVT variation of the memory column.

The above embodiments with respect to the memory device 100 are given for illustrative purposes. Various types of memory devices are within the contemplated scope of the present disclosure.

Reference is made to FIG. 2. FIG. 2 is a schematic diagram of a memory circuit 200 associated with the memory device 100 shown in FIG. 1, according to some embodiments of the present disclosure. With respect to the embodiments of FIG. 1, like elements in FIG. 2 are designated with the same reference number for ease of understanding. For simplicity, some components shown in FIG. 1 are not shown in FIG. 2. The memory circuit 200 associated with other components are within the completed scope of the present disclosure.

In some embodiments, the memory circuit 200 shown in FIG. 2 includes a switch 210 and a bit line keeper 220. For illustration, the first terminal of the switch 210 is coupled to the memory column 110. The second terminal of the switch 210 is coupled to the reference voltage Vref. The control terminal of the switch 210 is configured to receive a control signal BLPRCH. The switch 210 is configured to receive a memory signal RBL from the memory column 110. Based on the control signal BLPRCH, the memory signal RBL is selectively transmitted to the bit line keeper 220. For illustration in FIG. 2, when the switch 210 is turned off by the control signal BLPRCH, the memory signal RBL is transmitted to the bit line keeper 220. When the switch 210 is turned on by the control signal BLPRCH, a node P is pulled down through the switch 210 to the reference voltage Vref, which indicates, for illustration, that the memory signal RBL is not transmitted to the bit line keeper 220.

In some embodiments, the compensation circuit 130 shown in FIG. 2 is configured to receive the dummy signal RBL_DUM from the dummy column 120, and the compensation circuit 130 is also configured to enable/disable the bit line keeper 220 according to the dummy signal RBL_DUM.

In some embodiments, the memory circuit 200 further includes a switch 230 which is configured to receive an output signal PROC from the compensation circuit 130. For illustration, the control terminal of the switch 230 is coupled to the output of the compensation circuit 130, and the first terminal of the switch 230 is coupled to the bit line keeper 220. In some embodiments, the switch 230 is a PMOS transistor. The implementation and arrangement of the switch 230 as discussed above is given for illustrative purposes. Various implementations and various arrangements of the switch 230 are within the contemplated scope of the present disclosure.

The bit line keeper 220 is configured to receive the memory signal RBL and provide the output Q. In some embodiments, the bit line keeper 220 is activated by the switch 230 to provide the output Q. For illustration, when the switch 230 is turned on, the bit line keeper 220 is activated, such that the bit line keeper 220 provides the output Q in response to the memory signal RBL.

In some embodiments, the bit line keeper 220 includes a switch 220*a* and an inverter 220*b*. For illustration of FIG. 2, the input terminal of the inverter 220*b* is coupled to the first terminal of the switch 220*a*. The output terminal of the inverter 220*b* is coupled to the control terminal of the switch 220*a*. The second terminal of the switch 220*a* is coupled to the switch 230. In some embodiments, the switch 220*a* is implemented by a PMOS transistor.

For illustration of FIG. 2, when the switch 210 is turned off, the switch 230 is turned off, and the switch 220*a* is turned off correspondingly. The inverter 220*b* then inverts the memory signal RBL from the memory column 110, to generate the output Q.

On the other hand, when the switch 230 is turned on, the switch 220*a* is turned on correspondingly. With the switch 220*a* being turned on and the inverter 220*b*, the inverted signal outputted from the inverter 220*b* is able to be maintained and provided as the output Q. For illustration, the inverter 220*b* inverts a signal of logic 1 and generates a signal of logic 0 as the output Q. The signal of logic 0 then turns on the switch 220*a*, while the switch 230 is still turned on. Accordingly, the signal of logic 1 is able to be transmitted through the turn-on switches 230 and 220*a* to the input of the inverter 220*b*, and the same operation as discussed above repeats.

The configurations of the bit line keeper 220 and the switch 230, as discussed above, are given for illustrative purposes. Various configurations of the bit line keeper 220 and the switch 230 are within the contemplated scope of the present disclosure. For example, in various embodiments, the bit line keeper 220 further includes an additional inverter (not shown) coupled in series to the inverter 220*b*.

The above configuration of the memory circuit 200 is given for illustrative purposes. Various configurations of the memory circuit 200 are with the contemplated scope of the present disclosure.

One of ordinary skill in the art would understand that, in some embodiments, the number of the switch 210, the switch 230 and the bit line keeper 220 varies with respect to the number of the memory columns in the memory array 110. Alternatively stated, the switch 210, the switch 230 and the bit line keeper 220, as shown in FIG. 2, is given for illustrative purposes. For ease of understanding, some components in the memory circuit 200 are omitted in FIG. 2.

Figure 3:
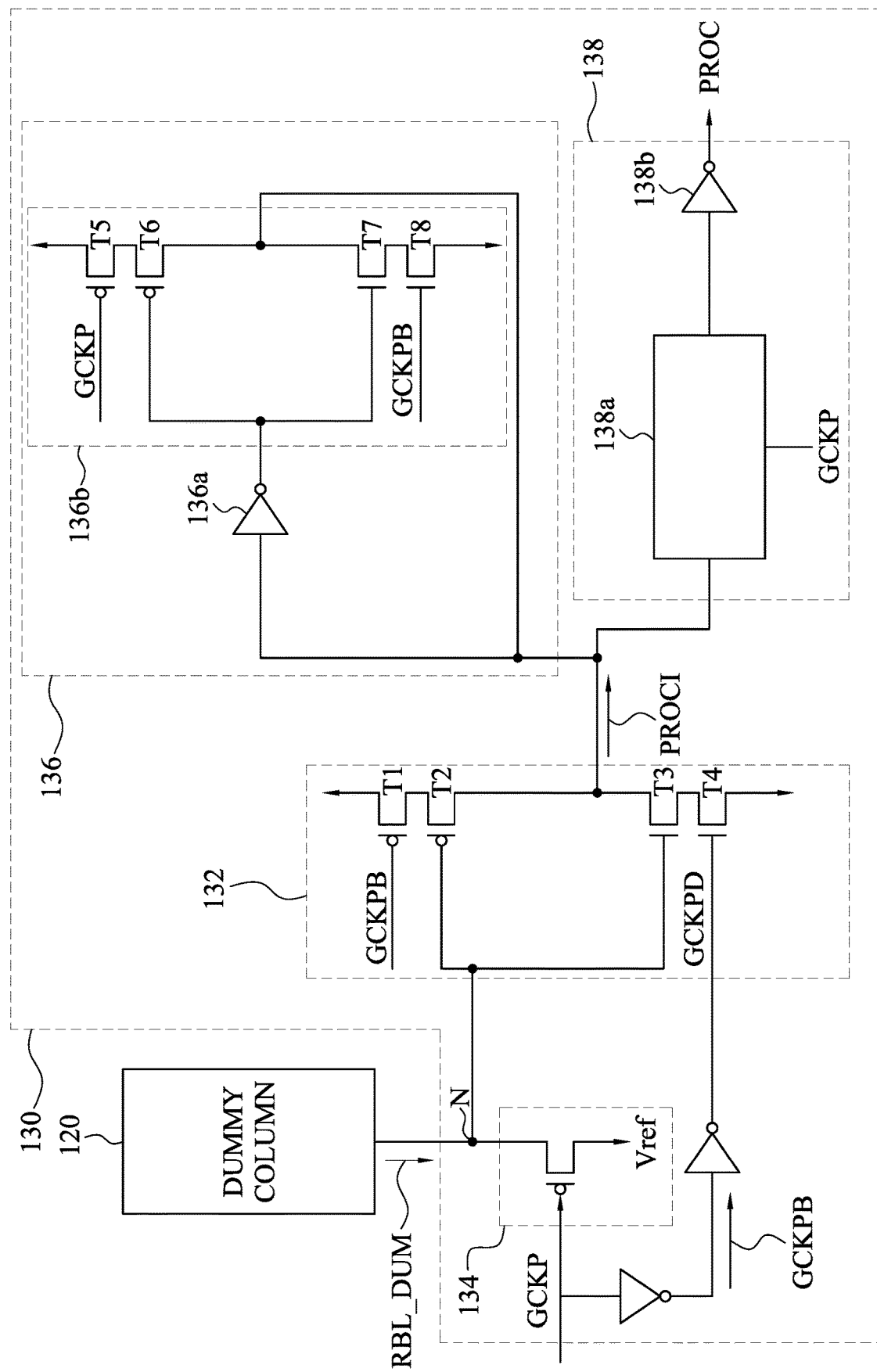
FIG. 3 is a schematic diagram associated with the dummy column and the compensation circuit of the memory device in FIG. 2, according to some embodiments of the present disclosure.

Reference is made to FIG. 3. FIG. 3 is a schematic diagram associated with the dummy column 120 and the compensation circuit 130 of the memory circuit 200, according to some embodiments of the present disclosure. With respect to the embodiments of FIG. 1, like elements in FIG. 3 are designated with the same reference number for ease of understanding.

In some embodiments, the compensation circuit 130 includes an inverter unit 132. The inverter unit 132 is configured to invert the dummy signal RBL_DUM from the dummy column 120, in response to a clock signal GCKPD and a clock signal GCKPB.

For illustration, the input terminal of the inverter unit 132 is coupled to the dummy column 120. The first control terminal of the inverter unit 132 is coupled to the clock signal GCKPB, and the second control terminal of the inverter unit 132 is coupled to the clock signal GCKPD. The inverter unit 132 is controlled by the output of the dummy column 120, the clock signal GCKPB, and the clock signal GCKPD.

Figure 5:
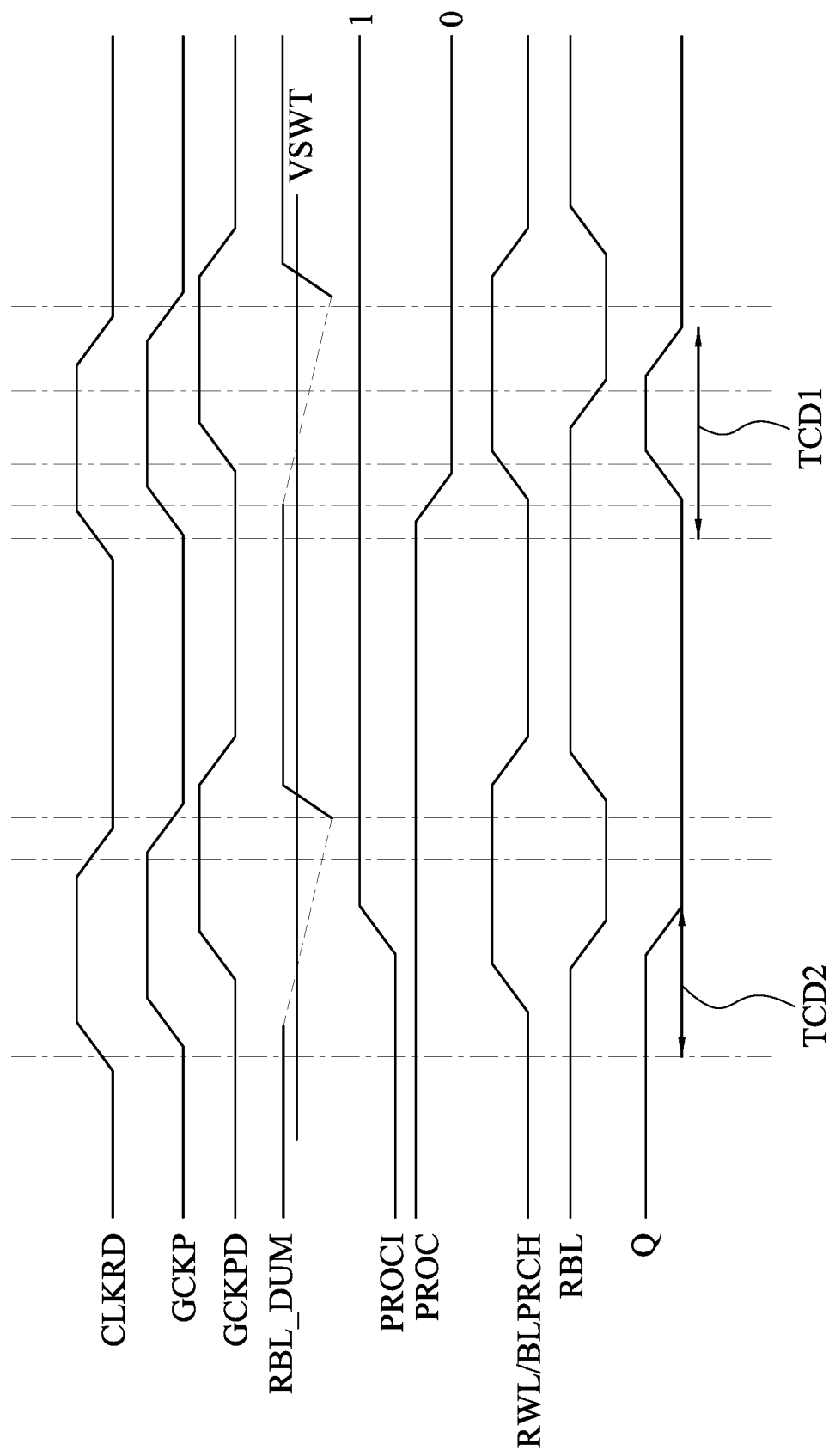
FIG. 5 is a timing diagram of signals applied to the memory circuit 200 in FIG. 2, according to some embodiments of the present disclosure.
Figure 6:
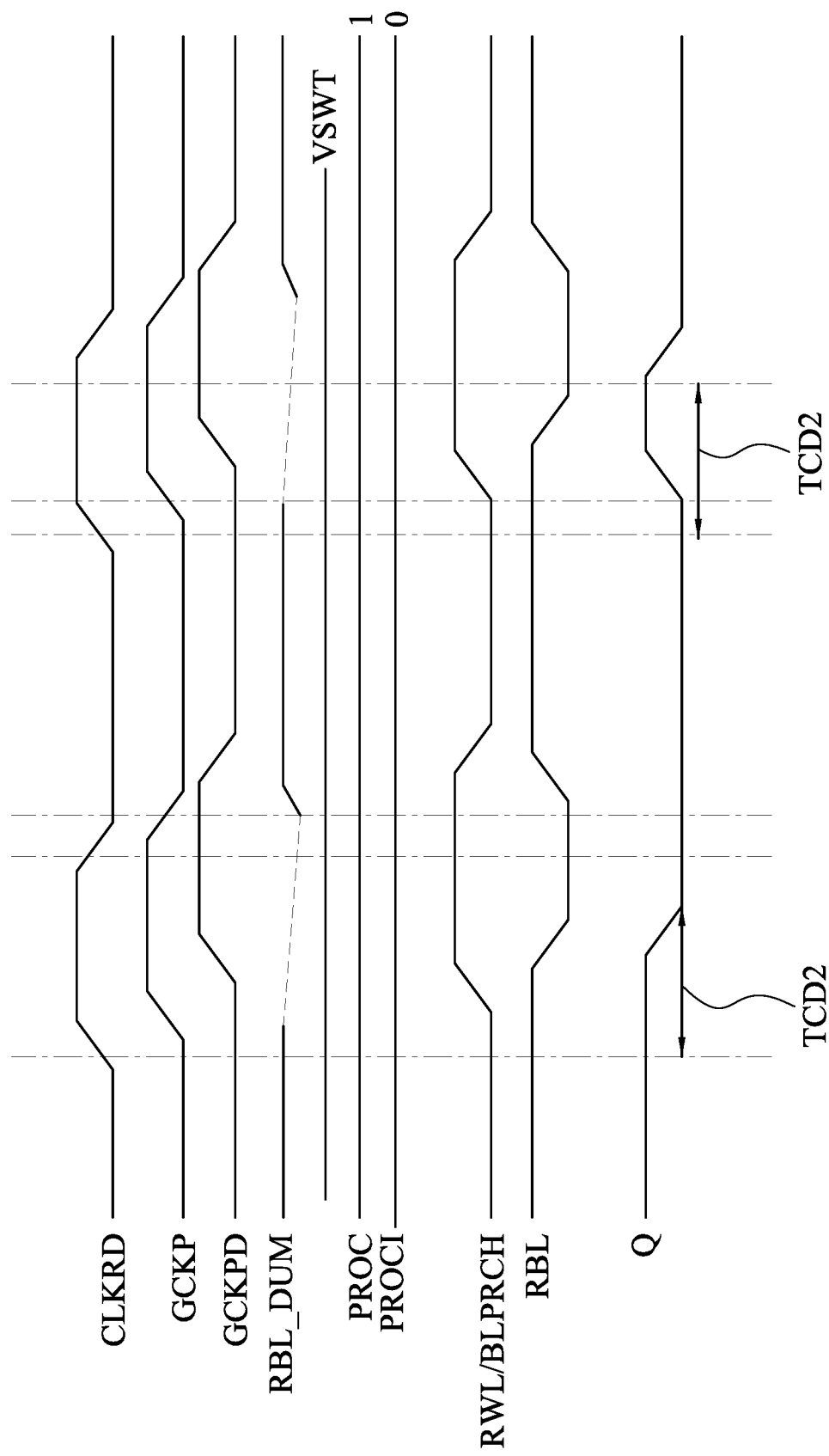
FIG. 6 is a timing diagram of signals applied to the memory circuit 200 in FIG. 2, according to some embodiments of the present disclosure.

In some embodiments, the inverter unit 132 has a switching threshold VSWT, which is illustrated in FIGS. 5 and 6. During operation, when the inverter unit 132 receives a signal which crosses the switching threshold VSWT, the inverter unit 132 inverts the received signal crossing the switching threshold VSWT. Alternatively, when the inverter unit 132 receives a signal which does not cross the switching threshold VSWT, the inverter unit 132 does not invert the received signal. In some embodiments, the switching threshold VSWT is lower than a system logic high level which is indicated by, for example, a supply voltage VDD, and is higher than a system logic low level which is indicated by, for example, a ground voltage GND.

In some embodiments, the clock signal GCKPD is a clock signal generated by delaying a clock signal GCKP, with two inverters, for illustration in FIG. 3. In some embodiments, the clock signal GCKPB is a clock signal generated by inverting the clock signal GCKP. In some embodiments, the clock signal GCKPD and the clock signal GCKPB are synchronous but are inverted to each other. In some other embodiments, the clock signal GCKPD and the clock signal GCKPB are not synchronous but the phase difference of these two signals is smaller than a period of the clock signal GCKP.

In some embodiments, the inverter unit 132 is configured to output a signal PROCI as the output signal PROC, or to be converted to the output signal PROC, for the enabling or disabling of the bit line keeper 220 shown in FIG. 2. In some embodiments, the inverter unit 132 includes a tri-state inverter. The tri-state inverter has the first terminal for receiving the clock signal GCKPB, the second terminal for receiving the clock signal GCKPD, the third terminal for receiving the dummy signal RBL_DUM from the dummy column 120, and an output terminal for outputting the signal PROCI.

For illustration in FIG. 3, the inverter unit 132 includes four transistors T1-T4. The first terminal of the transistor T1 is coupled to, for illustration, the supply voltage (not shown). The second terminal of the transistor T1 is coupled to the first terminal of the transistor T2. The control terminal of the transistor T1 is configured to receive the clock signal GCKPB. The second terminal of the transistor T2 is coupled to the first terminal of the transistor T3. The control terminal of the transistor T2 is coupled to the dummy column 120. The second terminal of the transistor T3 is coupled to the first terminal of the transistor T4. The control terminal of the transistor T3 is coupled to the dummy column 120 and the control terminal of the transistor T2. The second terminal of the transistor T4 is coupled to, for illustration, the reference voltage (e.g., ground voltage) (not shown). The control terminal of the transistor T4 is configured to receive the clock signal GCKPD. In some embodiments, the transistors T1 and T2 are PMOS transistors. In some embodiments, the transistors T3 and T4 are NMOS transistors.

The configuration of the inverter unit 132 is given for illustrative purposes. Various configurations of the inverter unit 132 are within the contemplated scope of the present disclosure. For example, in various embodiments, the signals received by the transistors T1 and T4 are exchanged.

In some embodiments, the compensation circuit 130 further includes a switch 134. The switch 134 is coupled between the dummy memory column 120 and the reference voltage Vref. The switch 134 is configured to, in response to the clock signal GCKP, activate/deactivate the inverter unit 132.

For illustration of FIG. 3, the first terminal of the switch 134 is coupled to the dummy column 120 and the inverter unit 132 at a node N. The second terminal of the switch 134 is coupled to the reference voltage Vref. The control terminal of the switch 134 is configured to receive the clock signal GCKP. In some embodiments, the switch 134 includes a PMOS transistor or is implemented by a PMOS transistor.

For illustration of operation, when the switch 134 is turned off, the switch 134 is seen as an open circuit at the node N, and the dummy column 120 transmits the dummy signal RBL_DUM to the inverter unit 132. Correspondingly, in response to the clock signal GCKPD and the clock signal GCKPB, the inverter unit 132 is activated, and the inverter unit 132 inverts the received dummy signal RBL_DUM to output the signal PROCI.

Alternatively, when the switch 134 is turned on, the node N is pulled down through the switch 134 to the reference voltage Vref. Correspondingly, in response to the clock signal GCKPD and the clock signal GCKPB, the inverter unit 132 is deactivated.

In some embodiments, the compensation circuit 130 further includes a keeper unit 136. The keeper unit 136 is configured to receive and maintain a logic level of the output signal PROCI of the inverter unit 132. The keeper unit 136 is operated in response to the clock signal GCKP, the clock signal GCKPB and the output signal PROCI of the inverter unit 132.

In some embodiments, the keeper unit 136 includes an inverter 136a and a tri-state inverter 136b. The inverter 136a and the tri-state inverter 136b are coupled in series. For illustration, the tri-state inverter 136b includes four transistors T5-T8. The first terminal of the transistor T5 is coupled to the supply voltage (not shown). The second terminal of the transistor T5 is coupled to the first terminal of the transistor T6. The control terminal of the transistor T5 is configured to receive the clock signal GCKP. The second terminal of the transistor T6 is coupled to the first terminal of the transistor T7. The control terminal of the transistor T6 is coupled to the inverter 136a. The second terminal of the transistor T7 is coupled to the first terminal of the transistor T8. The control terminal of the transistor T7 is coupled to the output of the inverter 136a and the control terminal of the transistor T6. The second terminal of the transistor T8 is coupled to the reference voltage (e.g., ground voltage) (not shown). The control terminal of the transistor T8 is coupled to the clock signal GCKPB. The input terminal of the inverter 136a is coupled to the inverter unit 132 to receive the signal PROCI. The input terminal of the inverter 136a is further coupled to the second terminal of the transistor T6 and the first terminal of the transistor T7. Accordingly, the input and the output of the keeper unit 136 are coupled together, for illustration in FIG. 3. In some embodiments, the transistors T5 and T6 are PMOS transistors. In some embodiments, the transistors T7 and T8 are NMOS transistors.

In some embodiments, the keeper unit 136 is operated based in response to the clock signal GCKP and the clock signal GCKPB with the same temporal order of the inverter unit 132. In alternative embodiments, the keeper unit 136 is not operated with the temporal order of the inverter unit 132.

The configuration of the keeper unit 136 is given for illustrative purposes. Various configurations of the keeper unit 136 are within the contemplated scope of the present disclosure. For example, in various embodiments, the keeper unit 136 is implemented by a two-end component, which indicates that the input and the output of the keeper unit 136 are not coupled together.

In some embodiments, the compensation circuit 130 further includes a delay unit 138. The delay unit 138 is configured to delay the output signal PROCI of the inverter unit 132 and output the output signal PROC. In some other embodiments, the delay unit 138 is further configured to invert the output signal PROCI of the inverter unit 132, or the delayed output signal PROCI, before outputting the output signal PROC.

In some embodiments, the delay unit 138 includes a D flip-flop 138a and an inverter 138b. For illustration, the D flip-flop 138a and the inverter 138b are coupled in series. The D flip-flop 138a delays the output signal PROCI in response to the clock signal GCKP, and the inverter 138b inverts the signal outputted by the D flip-flop 138a.

For illustration in FIG. 3, the input terminal of the D flip-flop 138a is coupled to the inverter unit 132 to receive the output signal PROCI. The output terminal of the D flip-flop 138a is coupled to the input terminal of the inverter 138b. The control terminal of the D flip-flop 138a is configured to receive the clock signal GCKP. The output terminal of the inverter 138b is coupled to the switch 230 as shown in FIG. 2. In the embodiments including the delay unit 138 and the keeper unit 136, the input terminal of the D flip-flop 138a is further coupled to the keeper unit 136, as shown in FIG. 3.

The above configuration of the delay unit 138 is given for illustrative purposes. Various configurations of the delay unit 138 are within the contemplated scope of the present disclosure. For example, in various embodiments, in the delay unit 138, the locations of the D flip-flop 138a and the inverter unit 132 are exchanged.

The above configurations and operations of the compensation circuit 130 in FIG. 3 are given for illustrative purposes. Various configurations and operations of the compensation circuit 130 are within the contemplated scope of the present disclosure. For example, in various embodiments, the compensation circuit 130 includes the delay unit 138 without the keeper unit 136, and in alternative embodiments, the compensation circuit 130 includes the keeper unit 136 without the delay unit 138.

Figure 4:
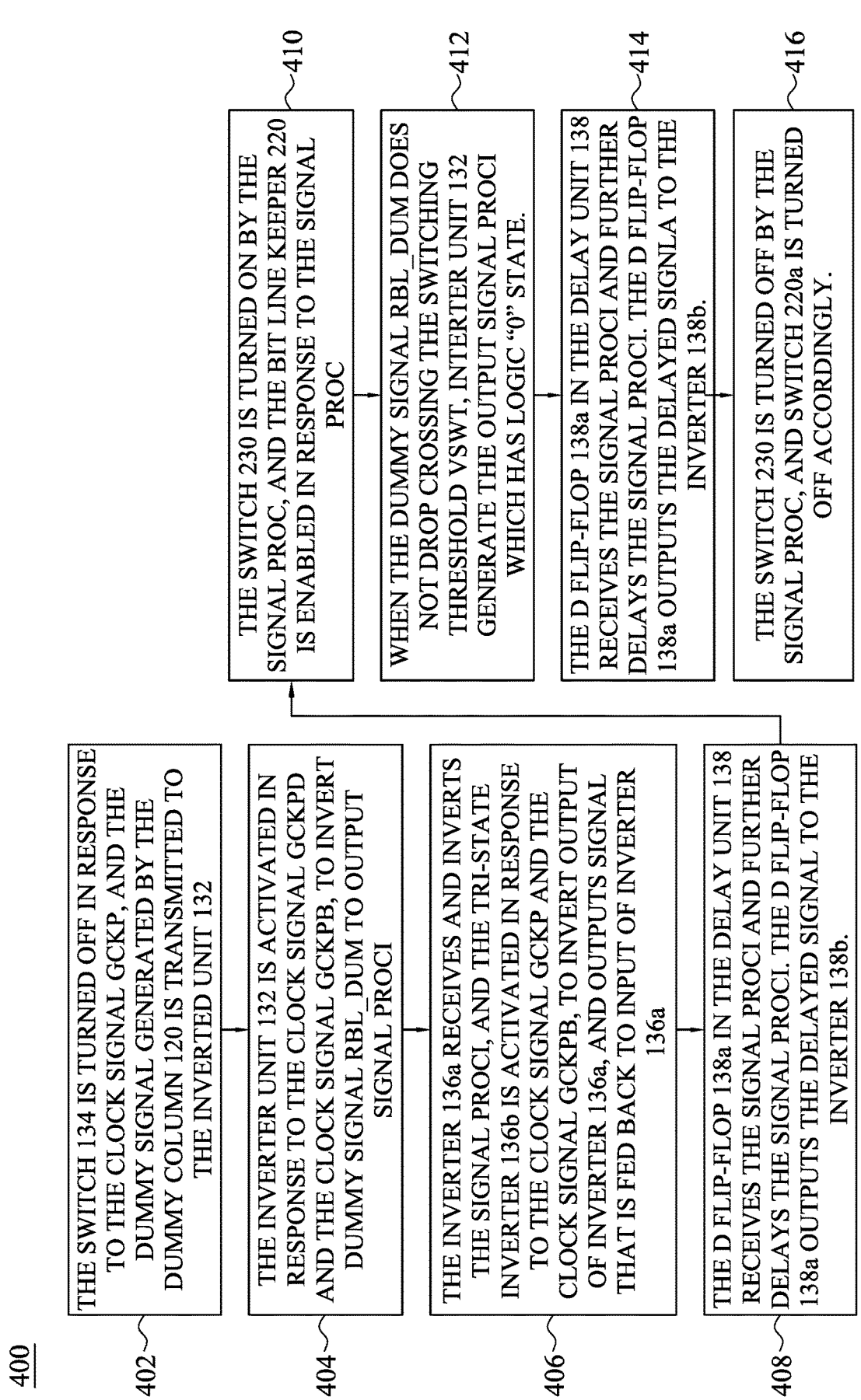
FIG. 4 is a flow chart of a method 400 illustrating the operations of the memory circuit 200 in FIG. 2 and FIG. 3, according to some embodiments of the present disclosure.

Reference is made to FIG. 4. FIG. 4 is a flow chart of a method 400 illustrating the operations of the memory circuit 200 in FIG. 2 and the compensation circuit 130 in FIG. 3, according to some embodiments of the present disclosure. FIG. 5 is a timing diagram of signals applied to the memory circuit 200 in FIG. 2 and the compensation circuit 130 in FIG. 3, according to some embodiments of the present disclosure. For illustration, "CLKRD" in FIG. 5 indicates a reference clock signal (not shown) in the compensation circuit 130, "GCKP" in FIG. 5 indicates the clock signal GCKP in FIG. 3, "GCKPD" in FIG. 5 indicates the clock signal GCKPD which is the clock signal delayed from clock signal GCKP in FIG. 3, "RBL_DUM" in FIG. 5 indicates the dummy signal RBL_DUM in FIG. 2 and FIG. 3, "PROC" in FIG. 5 indicates the output signal PROC from the delay unit 138 in FIG. 3, "PROCI" in FIG. 5 indicates the output signal PROCI from the inverter unit 132 in FIG. 3, "BLPRCH" in FIG. 5 indicates the signal controlling the switch 210 in FIG. 2, "RBL" in FIG. 5 indicates the memory signal RBL in FIG. 2, and "Q" in FIG. 5 indicates the output signal Q of the bit line keeper 220 in FIG. 2. Moreover, "1" in FIG. 5 indicates a logic high state, "0" in FIG. 5 indicated a logic low state, "VSWT" in FIG. 5 indicates the switching threshold of the inverter unit 132 in FIG. 3, and "TCD1" and "TCD2" in FIG. 5 indicate different response time durations while the states of the output signal Q are switched.

Correspondingly, FIG. 6 is a timing diagram of signals applied to the memory circuit 200 in FIG. 2 and the compensation circuit 130 in FIG. 3, according to some other embodiments of the present disclosure. With respect to the embodiments of FIG. 5, like signals in FIG. 6 are designated with the same reference for ease of understanding.

Operations of the memory circuit 200 in FIG. 2 and the compensation circuit 130 in FIG. 3 are described by the method 400 in FIG. 4 with reference to FIG. 5 and FIG. 6. For simplicity, following operations are explained with reference to the memory circuit 200 in FIG. 2 and the compensation circuit 130 in FIG. 3. Operations associated with other circuitries are within the contemplated scope of the present disclosure.

In operation 402, with reference to FIGS. 3 and 5, the switch 134 is turned off in response to the clock signal GCKP, and the dummy signal RBL_DUM generated by the dummy column 120 is transmitted to the inverter unit 132. For illustration in FIG. 5, the clock signal GCKP raises from a system low state to a system high state, and accordingly, the switch 134 is turned off by the clock signal GCKP.

In operation 404, with reference to FIGS. 3 and 5, the inverter unit 132 is activated in response to the clock signal GCKPD and the clock signal GCKPB, to invert the dummy signal RBL_DUM to the output signal PROCI. When the dummy signal RBL_DUM drops crossing the switching threshold VSWT, which indicates a high leakage of the memory device 100 shown in FIG. 1, the dummy signal RBL_DUM is inverted by the inverter unit 132 to the output signal PROCI which, for illustration in FIG. 5, raises to have a logic "1" state. For illustration in FIG. 5, the clock signal GCKPD raises to the system high state, while the clock signal GCKPB drops to the system low state (not shown).

In operation 406, with reference to FIGS. 3 and 5, the inverter 136a receives and inverts the signal PROCI. The tri-state inverter 136b is activated in response to the clock signal GCKP and the clock signal GCKPB, to invert the output of the inverter 136a, and outputs the signal that is fed back to the input of the inverter 136a. With the operations of the inverter 136a and the tri-state inverter 136b, the signal PROCI is able to be maintained for following operations.

In operation 408, with reference to FIGS. 3 and 5, the D flip-flop 138a in the delay unit 138 receives the signal PROCI and further delays the signal PROCI. Then, the D flip-flop 138a outputs the delayed signal to the inverter 138b. Moreover, the inverter 138b inverts the received signal and outputs the signal PROC. Alternatively stated, the signal PROC is generated and inverted from the signal PRCOI. For illustration in FIG. 5, the output signal PROC has a logic "0" state, while the signal PROCI has a logic "1" state. For illustration in FIG. 5, the time difference between the raising of the signal PROCI and the falling of the signal PROC indicates the time period delayed by the delay unit 138.

In operation 410, with reference to FIGS. 2 and 5, the switch 230 is turned on by the signal PROC, and the bit line keeper 220 is enabled in response to the signal PROC. In such a situation, the memory signal RBL of, for illustration, logic "1" state, is inverted by the inverter 220b to be of, for illustration, logic "0" state, thus turning on the switch 220a. Accordingly, the voltage level of the node P, corresponding to the memory signal RBL, is pulled up through the turn-on switches 230 and 220a, and thus the logic state of the memory signal RBL is maintained with the operations of the turn-on switch 220a and the inverter 220b. The output signal Q corresponding to the memory signal RBL is thus generated.

In operation 412, with reference to FIGS. 3 and 6, when the dummy signal RBL_DUM does not drop crossing the switching threshold VSWT, which indicates a low leakage of the memory device 100 shown in FIG. 1, the inverter unit 132 generate the output signal PROCI which has the logic "0" state, for illustration in FIG. 6. In a subsequent operation, the inverter 136*a* and the tri-state inverter 136*b* in the keeper unit 136 are also able to receive and process the output signal PROCI which has the logic "0" state, to maintain the output signal PROCI, as discussed above.

In operation 414, with reference to FIGS. 3 and 6, the D flip-flop 138*a* also receives and delays the signal PROCI and outputs the delayed signal PROCI to the inverter 138*b*. The inverter 138*b* then inverts the delayed signal PROCI and outputs the signal PROC. For illustration in FIG. 6, the output signal PROC has a logic "1" state, while the signal PROCI has a logic "0" state.

In operation 416, with reference to FIGS. 2 and 6, the switch 230 is turned off by the signal PROC, and the switch 220*a* is turned off accordingly. Accordingly, the memory signal RBL is inverted by the inverter 220*b*, without being maintained at a logic state. The output signal Q corresponding to the memory signal RBL is thus generated as well. With the switch 220*a* and switch 230 being turned off, the memory signal RBL transmitting through the bit line keeper 220 only needs a shorter response time, compared to the operation 410 as discussed above, because of, for illustration, a relatively smaller RC constant compared to that caused by the switch 220*a* and switch 230.

In some approaches, the bit line keeper 220 as discussed above is kept activated to maintain the memory signal RBL as shown in FIG. 2, above a threshold voltage, for example, during a read "0" operation. However, since the bit line keeper 220 is kept activated to maintain the memory signal RBL in related approaches, the operation of the bit line keeper 220 would affect memory access time which is mainly dominated by read 0 operation, in which the response time duration is, for example, TCD1 as shown in FIG. 5.

Compared to the above approaches, the compensation circuit 130 and the switch 230 are provided in the present disclosure to cooperate with each other, in order to control the bit line keeper 220 turn off during appropriate operations. With the turn-off bit line keeper 220, the bit line keeper 220 would not contribute extra current to required memory read current, during, for example, a read "0" operation. Accordingly, a read "0" failure is able to be avoided. Alternatively stated, the compensation circuit 130 is able to detect a process of memory cell on chip, and once the process is detected, the bit line keeper 220 is able to be turned off. Without the bit line keeper 220 affecting the memory signal RBL, the memory access time and cycle time are able to be improved as well, in which the response time duration is, for example, TCD2 as shown in FIG. 6, which is shorter than TCD1 as shown in FIG. 5.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, the circuit is disclosed that includes the inverter unit and the switch unit. The inverter unit is coupled to a memory cell column. The inverter unit is configured to invert, in response to the first control signal and the second control signal, the first signal and to output the second signal for the enabling or disabling of the bit line keeper circuit that is configured to maintain a bit line to a voltage. The first signal is generated by the memory cell column. The switch unit is configured to couple a reference voltage to an input of the inverter unit, in response to the third control signal. The inverter unit is further configured to be deactivated in response to the reference voltage, the first control signal, and the second control signal.

In some embodiments, the inverter unit includes a tri-state inverter. The tri-state inverter has a first input, a second input, a third input, and an output. The first input is coupled to the memory cell column and the switch unit. The second input is configured to receive the first control signal. The third input is configured to receive the second control signal. The output is configured for outputting the second signal.

In some embodiments, the circuit further includes a keeper unit configured to receive and maintain the second signal outputted by the inverter unit.

In some embodiments, the keeper unit includes an inverter and a tri-state inverter. The inverter has an input coupled to an output of the inverter unit. The tri-state inverter has a first input coupled to an output of the inverter, a second input configured to receive the third control signal, a third input configured to receive the first control signal, and an output coupled to the output of the inverter unit.

In some embodiments, the circuit further includes a delay unit configured to delay the second signal, and configured to output a delay signal for the enabling or disabling of the bit line keeper circuit.

In some embodiments, the delay unit includes a flip-flop configured to be controlled by the third control signal. The flip-flop has an input for receiving the second signal and an output for outputting the delay signal.

In some embodiments, the circuit further includes an inverter configured to receive the delay signal and output an inverted delay signal for the enabling or disabling of the bit line keeper circuit.

In some embodiments, the inverter unit includes a first transistor, a second transistor, a third transistor, and a forth transistor. The third transistor and the fourth transistor are cascaded with the first transistor and the second transistor. A control terminal of the first transistor is configured to receive the first control signal. Control terminals of the second transistor and the third transistor are coupled to the memory cell column and the switch unit. A control terminal of the fourth transistor is configured to receive the second control signal.

In some embodiments, the circuit further includes a first inverter, a fifth transistor, a sixth transistor, a seventh transistor, an eighth transistor, a flip-flop, and a second inverter. The first inverter has an input coupled to first terminals of the second transistor and the third transistor. The seventh transistor and the eighth transistor are cascaded with the fifth transistor and the sixth transistor. A control terminal of the fifth transistor is configured to receive the third control signal. Control terminals of the sixth transistor and the seventh transistor are coupled to an output of the inverter. A control terminal of the eighth transistor is configured to receive the first control signal. The flip-flop has an input coupled to the first terminals of the second transistor and the third transistor. The second inverter has an input coupled to an output of the flip-flop, and an output coupled to the bit line keeper circuit.

In some embodiments, the first control signal is an inversion of the third control signal. The second control signal has a time delay with respect to the third control signal Also disclosed is the device that includes the bit line keeper circuit, the switch, the memory cell column, and the compensation circuit. The bit line keeper circuit is configured to maintain a bit line to a voltage. The switch is configured to be controlled by an enable signal in order to enable or disable the bit line keeper circuit. The memory cell column is configured to generate an operation signal. The compensation circuit is configured to generate, according to the operation signal, the enable signal for controlling the switch.

In some embodiments, the compensation circuit includes a first tri-state inverter. The first tri-state inverter is configured to invert, in response to a first control signal and a second control signal, the operation signal, to output an inverted operation signal for generation of the enable signal.

In some embodiments, the compensation circuit further includes a flip-flop and an inverter. The flip-flop is configured to be controlled by a third control signal, to delay the inverted operation signal and to output a delay signal. The inverter is configured to receive the delay signal and output an inverted delay signal as the enable signal.

In some embodiments, the compensation circuit further includes a keeper unit. The keeper unit is configured to receive and maintain the inverted operation signal outputted by the first tri-state inverter.

In some embodiments, the compensation circuit further includes an inverter and a second tri-state inverter. The inverter has an input coupled to an output of the first tri-state inverter. The second tri-state inverter is configured to have a first input coupled to an output of the inverter, a second input configured to receive a third control signal, a third input configured to receive the first control signal, and an output coupled to the output of the first tri-state inverter.

In some embodiments, the compensation circuit includes a first transistor, a second transistor, a third transistor, a fourth transistor, and a fifth transistor. The third transistor and the fourth transistor are cascaded with the first transistor and the second transistor. A control terminal of the first transistor is configured to receive a first control signal. Control terminals of the second transistor and the third transistor are coupled to the memory cell column. A control terminal of the fourth transistor is configured to receive a second control signal. The fifth transistor has a control terminal configured to receive a third control signal, a first terminal coupled to the control terminals of the second transistor and the third transistor, and a second terminal coupled to a reference voltage.

In some embodiments, the compensation circuit further includes a first inverter, a sixth transistor, a seventh transistor, an eighth transistor, a ninth transistor, a flip-flop, and a second inverter. The first inverter has an input coupled to first terminals of the second transistor and the third transistor. The eighth transistor and the ninth transistor are cascaded with the sixth transistor and the seventh transistor. The control terminal of the sixth transistor is configured to receive the third control signal. Control terminals of the seventh transistor and the eighth transistor are coupled to an output of the first inverter. The control terminal of the ninth transistor is configured to receive the first control signal. The flip-flop has an input coupled to the first terminals of the second transistor and the third transistor. The second inverter has an input coupled to an output of the flip-flop, and an output coupled to a control terminal of the switch.

Also disclosed is the method that includes in response to the first control signal and the second control signal, inverting the operation signal from the memory cell column, by the tri-state inverter, to the inverted operation signal, delaying the inverted operation signal to generate a\the delay signal, inverting the delay signal to generate the inverted delay signal as the enable signal, and by the enable signal, controlling the switch to enable or disable the bit line keeper circuit that is configured to maintain a bit line to a voltage.

In some embodiments, the method further includes maintaining the inverted operation signal by a keeper unit.

In some embodiments, the method further includes in response to a third control signal, coupling a reference voltage to an input of the tri-state inverter, and deactivating the tri-state inverter in response to the reference voltage, the first control signal, and the second control signal.

In this document, the term "coupled" may also be termed as "electrically coupled", and the term "connected" may be termed as "electrically connected". "Coupled" and "connected" may also be used to indicate that two or more elements cooperate or interact with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   an inverter unit coupled to a memory cell column, wherein the inverter unit is configured to invert, in response to a first control signal and a second control signal, a first signal that is generated by the memory cell column, to output a second signal for enabling or disabling of a bit line keeper circuit that is configured to maintain a bit line to a voltage; and
   a switch unit configured to couple, in response to a third control signal, a reference voltage to an input of the inverter unit, wherein the inverter unit is configured to be deactivated in response to the reference voltage, the first control signal, and the second control signal,
   wherein the first control signal is an inversion of the third control signal, and the second control signal has a time delay with respect to the third control signal.

2. The circuit of claim 1, wherein the inverter unit comprises:
   a tri-state inverter having a first input coupled to the memory cell column and the switch unit, a second input configured to receive the first control signal, a third input configured to receive the second control signal, and an output for outputting the second signal.

3. The circuit of claim 1, further comprising:
   a keeper unit configured to receive and maintain the second signal outputted by the inverter unit.

4. The circuit of claim 3, wherein the keeper unit comprises:
   an inverter having an input coupled to an output of the inverter unit; and
   a tri-state inverter having a first input coupled to an output of the inverter, a second input configured to receive the third control signal, a third input configured to receive the first control signal, and an output coupled to the output of the inverter unit.

5. The circuit of claim 1, further comprising:
   a delay unit configured to delay the second signal, and configured to output a delay signal for the enabling or disabling of the bit line keeper circuit.

6. The circuit of claim 5, wherein the delay unit comprises:

a flip-flop configured to be controlled by the third control signal, the flip-flop having an input for receiving the second signal, and an output for outputting the delay signal.

7. The circuit of claim 5, further comprising:
an inverter configured to receive the delay signal and output an inverted delay signal for the enabling or disabling of the bit line keeper circuit.

8. The circuit of claim 1, wherein the inverter unit comprises:
a first transistor and a second transistor; and
a third transistor and a fourth transistor cascaded with the first transistor and the second transistor;
wherein a control terminal of the first transistor is configured to receive the first control signal, control terminals of the second transistor and the third transistor are coupled to the memory cell column and the switch unit, and a control terminal of the fourth transistor is configured to receive the second control signal.

9. The circuit of claim 8, further comprising:
a first inverter having an input coupled to first terminals of the second transistor and the third transistor;
a fifth transistor and a sixth transistor;
a seventh transistor and an eighth transistor cascaded with the fifth transistor and the sixth transistor, a control terminal of the fifth transistor is configured to receive the third control signal, control terminals of the sixth transistor and the seventh transistor are coupled to an output of the first inverter, and a control terminal of the eighth transistor is configured to receive the first control signal;
a flip-flop having an input coupled to the first terminals of the second transistor and the third transistor; and
a second inverter having an input coupled to an output of the flip-flop, and an output coupled to the bit line keeper circuit.

10. A device, comprising:
a bit line keeper circuit configured to invert, in response to an enable signal, a bit line signal generated from a first memory cell column, to output an output signal for maintaining a bit line to a voltage;
a switch configured to be controlled by the enable signal in order to enable or disable the bit line keeper circuit;
a second memory cell column configured to generate an operation signal different from the bit line signal; and
a compensation circuit configured to generate, according to the operation signal, the enable signal for controlling the switch.

11. The device of claim 10, wherein the compensation circuit comprises:
a first tri-state inverter configured to invert, in response to a first control signal and a second control signal, the operation signal, to output an inverted operation signal for generation of the enable signal.

12. The device of claim 11, wherein the compensation circuit further comprises:
a flip-flop configured to be controlled by a third control signal, to delay the inverted operation signal and to output a delay signal; and
an inverter configured to receive the delay signal and output an inverted delay signal as the enable signal.

13. The device of claim 11, wherein the compensation circuit further comprises:
a keeper unit configured to receive and maintain the inverted operation signal outputted by the first tri-state inverter.

14. The device of claim 11, wherein the compensation circuit further comprises:
an inverter having an input coupled to an output of the first tri-state inverter; and
a second tri-state inverter configured to having a first input coupled to an output of the inverter, a second input configured to receive a third control signal, a third input configured to receive the first control signal, and an output coupled to the output of the first tri-state inverter.

15. The device of claim 10, wherein the compensation circuit comprises:
a first transistor and a second transistor;
a third transistor and a fourth transistor cascaded with the first transistor and the second transistor, wherein a control terminal of the first transistor is configured to receive a first control signal, control terminals of the second transistor and the third transistor are coupled to the second memory cell column, and a control terminal of the fourth transistor is configured to receive a second control signal; and
a fifth transistor having a control terminal configured to receive a third control signal, a first terminal coupled to the control terminals of the second transistor and the third transistor, and a second terminal coupled to a reference voltage.

16. The device of claim 15, wherein the compensation circuit further comprises:
a first inverter having an input coupled to first terminals of the second transistor and the third transistor;
a sixth transistor and a seventh transistor;
an eighth transistor and a ninth transistor cascaded with the sixth transistor and the seventh transistor, a control terminal of the sixth transistor is configured to receive the third control signal, control terminals of the seventh transistor and the eighth transistor are coupled to an output of the first inverter, and a control terminal of the ninth transistor is configured to receive the first control signal;
a flip-flop having an input coupled to the first terminals of the second transistor and the third transistor; and
a second inverter having an input coupled to an output of the flip-flop, and an output coupled to a control terminal of the switch.

17. A method, comprising:
in response to a first control signal and a second control signal, inverting an operation signal from a memory cell column, by a tri-state inverter, to an inverted operation signal;
delaying the inverted operation signal to generate a delay signal;
inverting the delay signal to generate an inverted delay signal as an enable signal; and
by the enable signal, controlling a switch to enable or disable a bit line keeper circuit that is configured to maintain a bit line to a voltage.

18. The method of claim 17, further comprising:
maintaining the inverted operation signal by a keeper unit.

19. The method of claim 17, further comprising:
in response to a third control signal, coupling a reference voltage to an input of the tri-state inverter; and
deactivating the tri-state inverter in response to the reference voltage, the first control signal, and the second control signal.

20. The circuit of claim 1, further comprising:
a keeper unit configured to receive and maintain the second signal outputted by the inverter unit, wherein the inverter unit comprises:
a tri-state inverter having a first input coupled to the memory cell column and the switch unit, a second input configured to receive the first control signal, a third input configured to receive the second control signal, and an output for outputting the second signal.

* * * * *